(12) United States Patent
Lee et al.

(10) Patent No.: US 7,115,945 B2
(45) Date of Patent: Oct. 3, 2006

(54) STRAINED SILICON FIN STRUCTURE

(75) Inventors: Jong-Jan Lee, Camas, WA (US);
Sheng Teng Hsu, Camas, WA (US);
Douglas J. Tweet, Camas, WA (US);
Jer-Shen Maa, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 11/327,092

(22) Filed: Jan. 6, 2006

(65) Prior Publication Data

US 2006/0113522 A1   Jun. 1, 2006

Related U.S. Application Data

(62) Division of application No. 10/602,436, filed on Jun. 23, 2003, now Pat. No. 7,045,401.

(51) Int. Cl.
*H01L 29/786* (2006.01)

(52) U.S. Cl. .................. 257/329; 257/328; 257/190; 257/E29.274; 257/E29.193; 257/E29.262; 257/E29.131; 438/156; 438/212

(58) Field of Classification Search ............. 257/263, 257/627, 328, 329
See application file for complete search history.

(56) References Cited

U.S. PATENT DOCUMENTS 6,475,869 B1 *  11/2002  Yu ........................... 438/303
6,855,990 B1 *   2/2005  Yeo et al. ................. 257/353
6,897,527 B1 *   5/2005  Dakshina-Murthy et al. ........................ 257/349
6,977,413 B1 *  12/2005  Hofmann et al. ........ 257/327
2004/0061178 A1 *   4/2004  Lin et al. ................ 257/350
2005/0199950 A1 *   9/2005  Chau et al. .............. 257/328
2005/0202604 A1 *   9/2005  Cheng et al. ............ 438/151
2005/0280103 A1 *  12/2005  Langdo et al. ........... 257/401

* cited by examiner

*Primary Examiner*—Jerome Jackson
*Assistant Examiner*—Paul Budd
(74) *Attorney, Agent, or Firm*—Law Office of Gerald Maliszewski; Gearld Maliszewski

(57) ABSTRACT

Disclosing is a strained silicon finFET device having a strained silicon fin channel in a double gate finFET structure. The disclosed finFET device is a double gate MOSFET consisting of a silicon fin channel controlled by a self-aligned double gate for suppressing short channel effect and enhancing drive current. The silicon fin channel of the disclosed finFET device is a strained silicon fin channel, comprising a strained silicon layer deposited on a seed fin having different lattice constant, for example, a silicon layer deposited on a silicon germanium seed fin, or a carbon doped silicon layer deposited on a silicon seed fin. The lattice mismatch between the silicon layer and the seed fin generates the strained silicon fin channel in the disclosed finFET device to improve hole and electron mobility enhancement, in addition to short channel effect reduction characteristic inherently in a finFET device.

9 Claims, 12 Drawing Sheets

Fig. 13
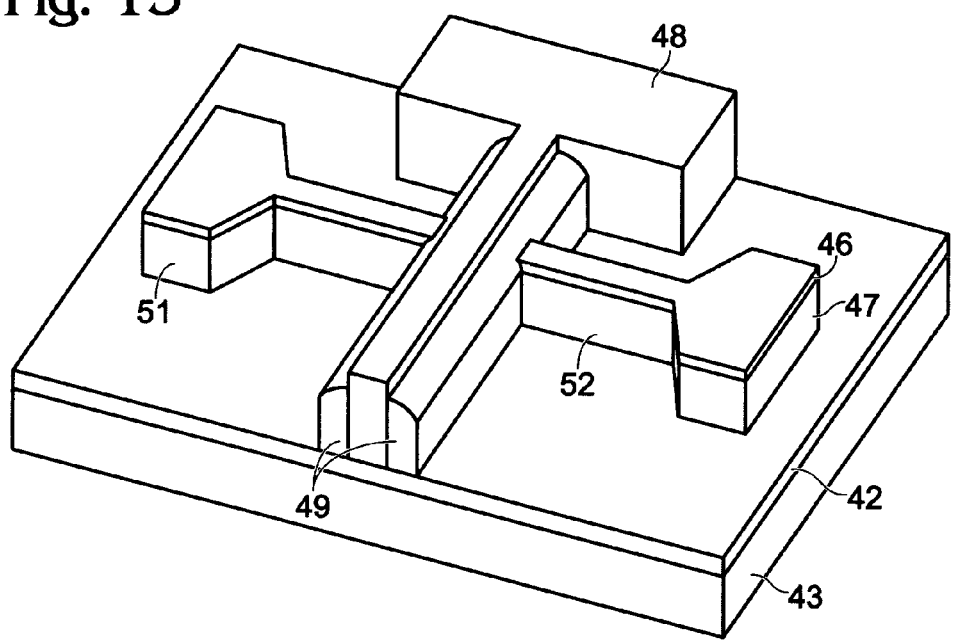
Fig. 16 (A-A')
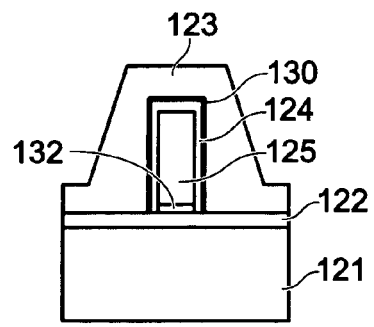
Fig. 17 (A-A')
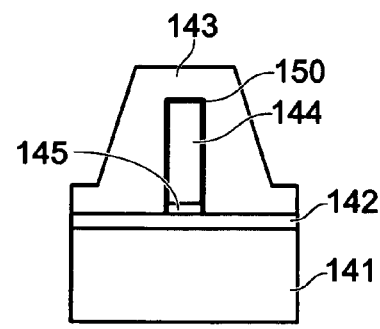

Fig. 14
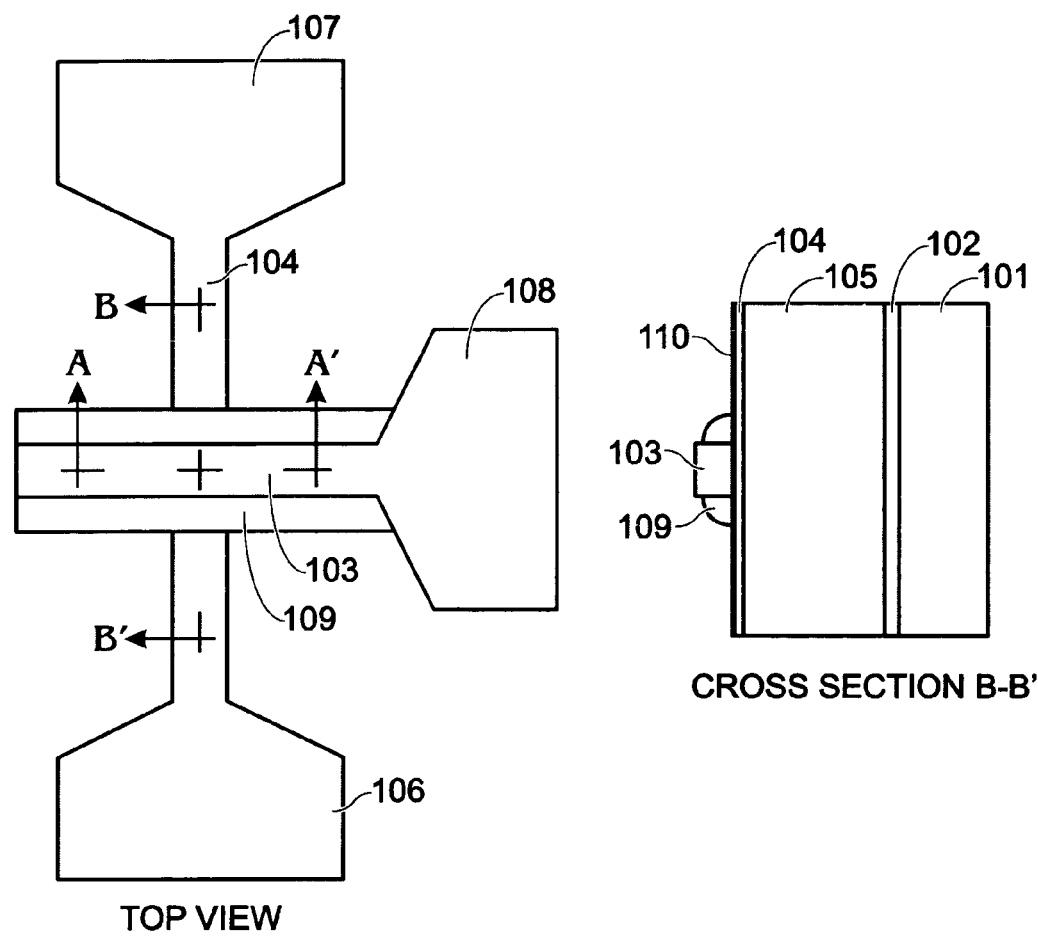
TOP VIEW
CROSS SECTION B-B'
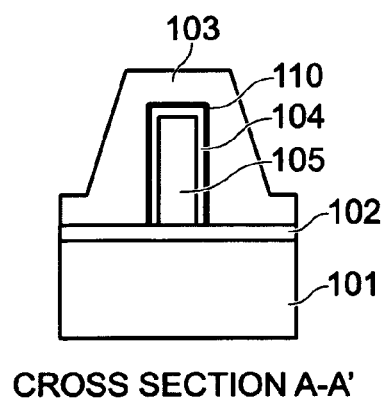
CROSS SECTION A-A'

Fig. 15
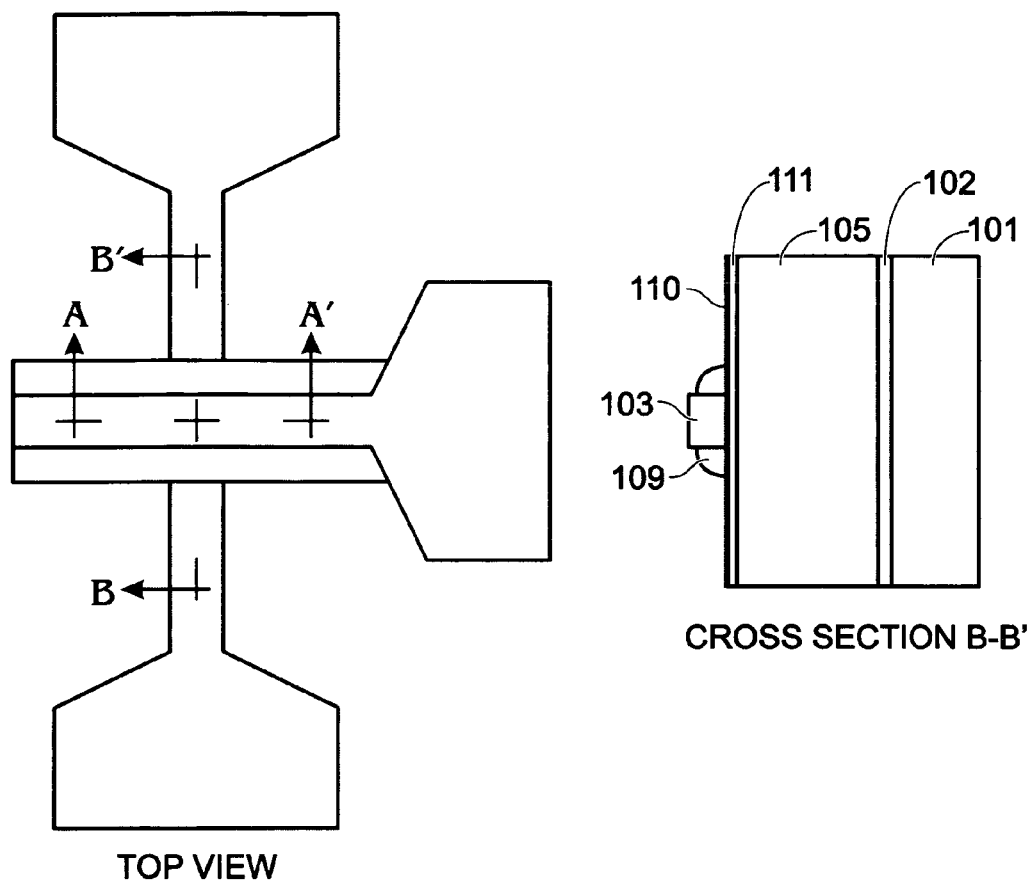
TOP VIEW
CROSS SECTION B-B'
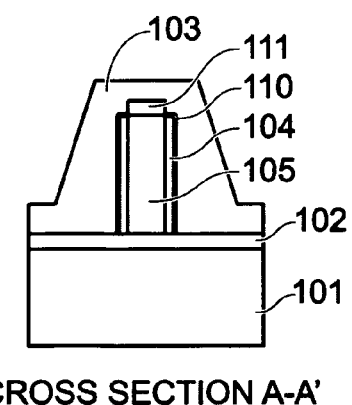
CROSS SECTION A-A'

Fig. 18a
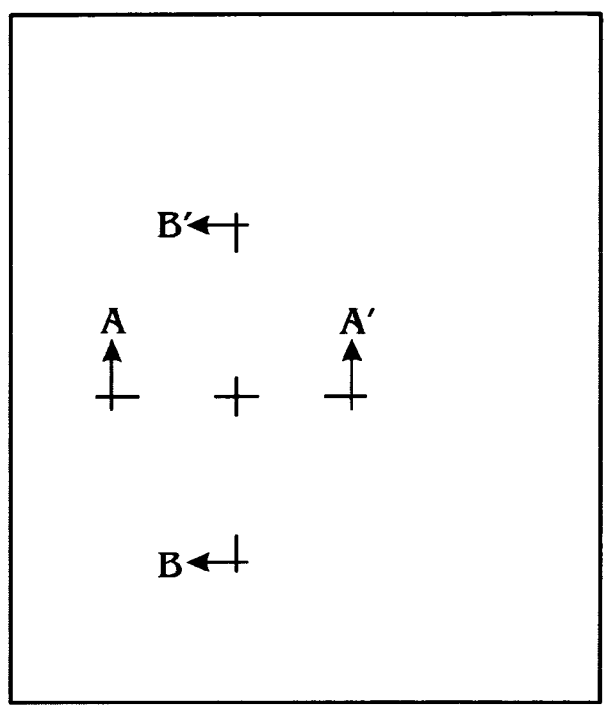
TOP VIEW
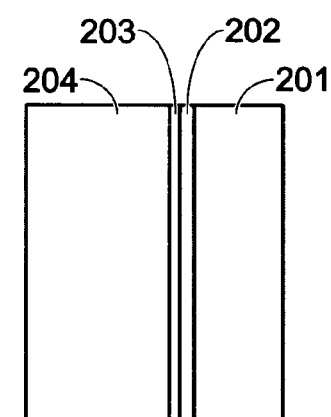
CROSS SECTION B-B'
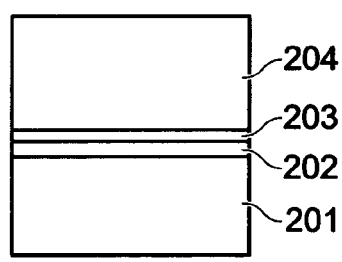
CROSS SECTION A-A'

Fig. 18b
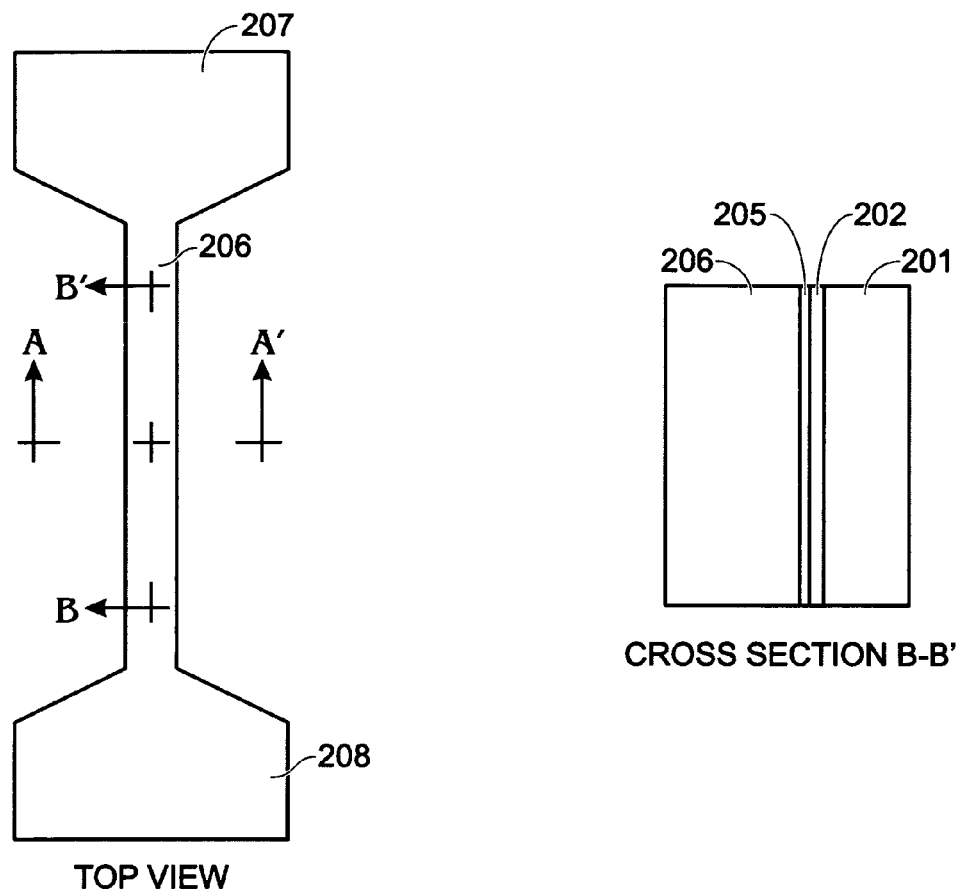
TOP VIEW
CROSS SECTION B-B'
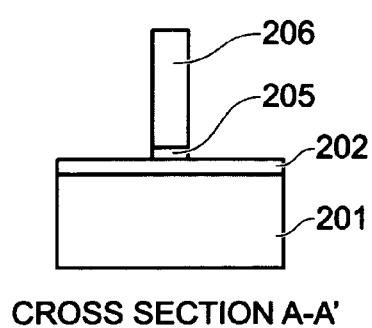
CROSS SECTION A-A'

Fig. 18c
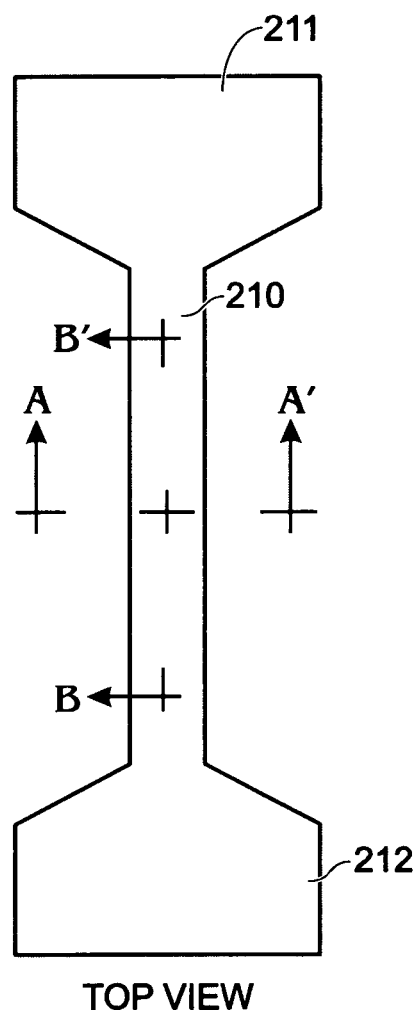
TOP VIEW
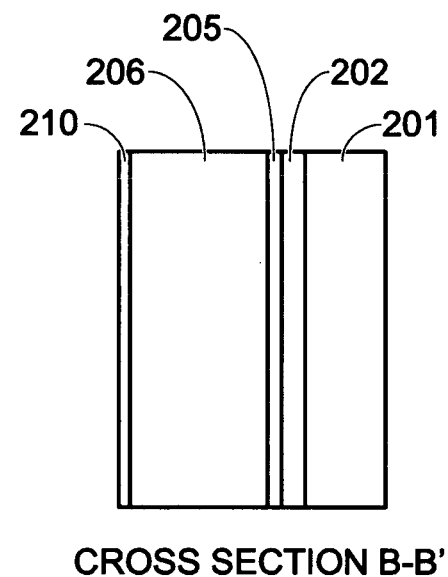
CROSS SECTION B-B'
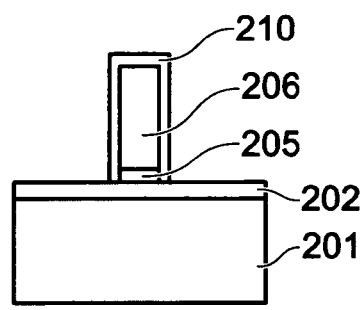
CROSS SECTION A-A'

Fig. 18d
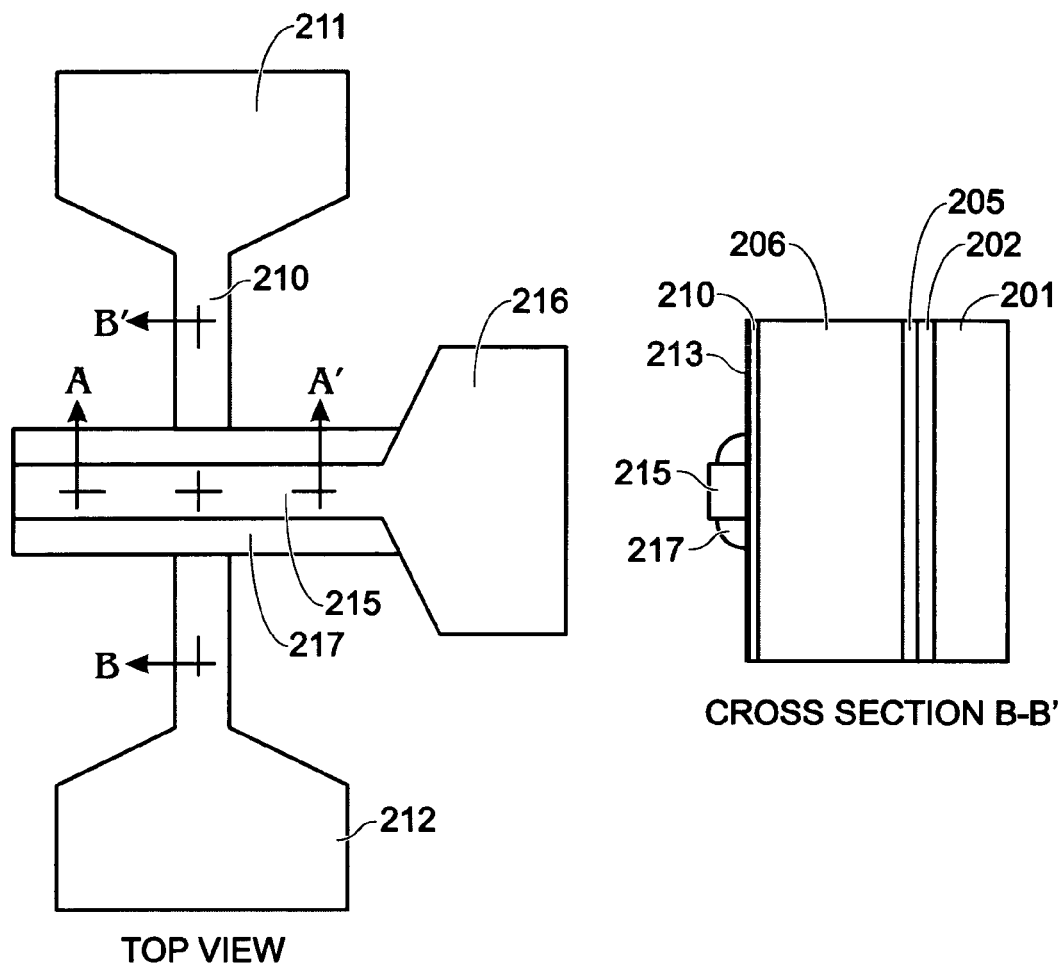
TOP VIEW
CROSS SECTION B-B'
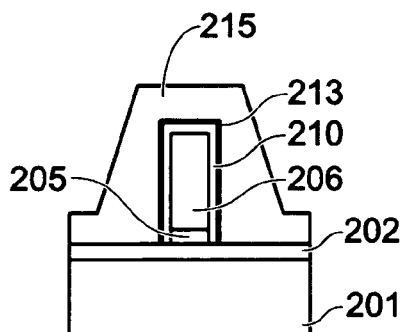
CROSS SECTION A-A'

STRAINED SILICON FIN STRUCTURE

RELATED APPLICATIONS

This application is a Divisional of a patent application entitled, Strained silicon finFET device, invented by Lee et al., Ser. No. 10/602,436, filed Jun. 23, 2003 now U.S. Pat. No. 7,045,401, which is incorporated herein by reference.

FIELD OF THE INVENTION

This invention related generally to semiconductor devices including field effect transistors (FETs), metal-oxide-semiconductor FETs (MOSFETs), and more particularly related to improved semiconductor devices having double gates and strained channel.

BACKGROUND OF THE INVENTION

Field effect transistors (FET's) and particularly Metal-Oxide-Semiconductor field effect transistors (MOSFETs) are the dominant electronic devices in use today. The performance of these devices has been improved steadily through the reduction in device dimensions, from 10–20 μm channel length in the '70 to 100 nm channel length in '00 technology.

As the channel length becomes smaller than 100 nm, MOSFET devices experience certain deleterious performance due to their size, such as the short channel effect caused by the close proximity of the source and drain, resulting in the reduction of the threshold voltage and the increase of sub-threshold current. With a short channel length, the source and drain regions may extend towards each other and may essentially occupy the entire channel area between the source and the drain. As a result of this effective occupation of the channel area by the source and drain, the channel is in part depleted and the gate charge necessary to alter the source and drain current flow is reduced. Thus the interaction between the source and drain of the MOSFET degrades the ability of the gate to control the operation of the device.

Therefore, scaling of conventional bulk MOSFET devices beyond the 50 nm process generations is very difficult. Straightforward scaling requires ultra thin gate dielectric (equivalent oxide thickness should be less than 0.5 nm), ultra shallow junction (less than 10 nm depth for reducing short channel effect) and high concentration channel doping ($>10^{18}$ cm$^{-3}$), all of which generate different problems of similar magnitude. For example, ultra thin gate oxide (less than 1–2 nm) has significant problem of tunneling current, and ultra shallow junction has significant problem of low sheet resistance and junction lateral steepness.

Significant innovations have been made to the conventional bulk MOSFET devices to improve their performance. Silicon-On-Insulator (SOI) substrate has enabled MOSFET devices to have higher speed, lower power and higher density. Strain-induced band modification of the device channel has enabled MOSFET devices to have enhanced carrier mobility and therefore increased drive current. Double gate MOSFET structure allows gate control of the channel from both sides, reducing short channel effect and allowing more current flow.

SOI wafers improve the transistor performance by reducing the operating silicon volume and by isolating the transistors. The thin surface silicon layer limits the volume of silicon that needs to be charged to switch the transistor on and off, and therefore reduces the parasitic capacitance of the transistor and increases the switching speed. The insulating layer isolates the transistor from its neighbors, and therefore reduces the leakage current and allows the transistor to operate at lower supply voltages and thus the transistors can be smaller and more densely packed.

Further improvement of the MOSFET device performance is the introduction of strain-induced band modification of the device channel. Generally speaking, a compressive strained channel MOSFET has significant hole mobility enhancement, and a tensile strained channel MOSFET achieves both significant hole and electron mobility enhancement. Enhanced carrier mobility allows strained silicon MOSFET devices to exhibit vastly increased performance over their bulk silicon counterparts at identical gate lengths.

Double gate MOSFET structure offers improvement for short channel effect reduction since it adds another gate on either side of the channel to allow gate control of the channel from both sides. Additionally, when the device is turned on using both gates, two conduction layers are formed, allowing more current flow. An extension of the double gate is the wrap-around gate where the gate is surrounding the channel. One variation of double gate MOSFET structure is finFET, a double gate device consists of a silicon channel formed in a silicon vertical fin controlled by a self-aligned double gate.

SUMMARY OF THE INVENTION

The present invention discloses a novel strained silicon finFET device on an insulator substrate having the advantages of finFET structure for suppressing short channel effect and strained channel MOSFET structure for mobility enhancement.

The disclosed strained silicon finFET device is a double gate finFET device having a strained silicon fin channel fabricated on an insulator substrate. The strained silicon fin channel is fabricated by forming a silicon-containing epitaxial layer on a silicon-containing seed fin having different lattice constant. By growing an epitaxial layer on a seed fin, the epitaxial layer will follow the single crystal nature of the seed fin, and by having different lattice constant, the epitaxial layer will experience lattice stress, which gives rise to a strained channel layer. If the lattice constant of the seed fin is larger than the lattice constant of the epitaxial layer, the epitaxial layer will try to extend itself to match the larger lattice constant, and therefore experience tensile stress and forming a tensile strained channel fin structure. If the lattice constant of the seed fin is smaller than the lattice constant of the epitaxial layer, the epitaxial layer will try squeeze itself into the smaller lattice constant, and therefore experience compressive stress and forming a compressive strained channel fin structure.

In one embodiment of the invention, the strained silicon fin channel comprises an epitaxial silicon layer deposited on a relaxed silicon germanium seed fin. Other embodiments of the invention include an epitaxial silicon layer deposited on a strained silicon germanium seed fin wherein the strained silicon germanium seed fin is deposited on an underseed relaxed silicon layer, and a strained channel silicon fin fabricated on a relaxed silicon germanium seed layer.

In a variation of the above embodiments, the strained silicon channel fin structure comprises an epitaxial carbon doped silicon (SiC) layer or an epitaxial carbon doped silicon germanium (SiGeC) layer deposited on a silicon germanium or a silicon seed fin.

The present invention strained silicon channel fin structure can be employed to fabricate a strained silicon finFET device. The present invention strained silicon finFET device comprises a thin strained silicon-containing fin channel standing on an insulator layer, sandwiching between a source and a drain. A gate dielectric and double gates cover the sides of the fin to form the inversion layers on the sides of the channel. The channel fin is sufficiently thin so that the two gates control the entire channel film. The double gates on the channel fin can suppress the short channel effect and enhance drive current. The strained channel can provide enhanced carrier mobility to further improve the device performance. The present invention strained channel finFET device thus can improve hole carrier mobility and/or electron carrier mobility, in addition to suppressing short channel effect.

BRIEF DESCRIPTION OF THE DRAWINGS

FIG. 13 shows a perspective view of the present invention strained silicon finFET device.

FIG. 14 shows different views of an embodiment of the disclosed strained silicon finFET device.

FIG. 15 shows a variation of the embodiment of FIG. 14.

FIG. 16 shows another variation of the embodiment of FIG. 14.

FIG. 17 shows another variation of the embodiment of FIG. 14.

FIGS. 18a–18e show the fabrication steps of the strained silicon finFET device in accordance with one embodiment of the invention.

DETAILED DESCRIPTION OF THE INVENTION

The present invention discloses a strained silicon fin structure and a strained silicon finFET device employing the disclosed strained silicon fin structure. The strained silicon fin structure is fabricated by forming a silicon-containing epitaxial layer on a silicon-containing seed fin having different lattice constant. The strained silicon finFET device comprises a strained silicon fin structure standing on an insulator layer, sandwiching between a source and a drain with a gate dielectric and a double gates covering the sides of the strained silicon fin structure to form the inversion layers on the sides of the fin.

The present invention strained silicon fin structure comprises a seed fin structure disposed on an insulator substrate, and a strained channel layer fabricated on the seed fin structure. The channel layer material has a lattice constant different than the lattice constant of the seed fin material, and therefore the channel layer becomes a strained channel layer due the lattice mismatch between the seed fin and the channel layer.

There are various variations of the present invention strained silicon fin structure: the seed fin can be strained, or relaxed (no strained at all or minimum strained); the channel layer can cover only the top side of the seed fin, or only the two sidewalls of the seed fin, or both the top side and the two sidewalls of the seed fin.

Figure 1:
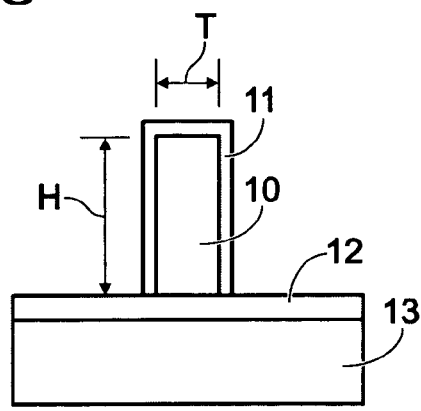
FIG. 1 shows an embodiment of the present invention strained silicon channel fin structure.

An embodiment of the present invention strained silicon fin structure is shown in FIG. 1 wherein the channel layer covers both the top side and the two sidewalls of the seed fin. The seed fin of this embodiment can be a strained seed fin, but preferably a relaxed seed fin.

In FIG. 1, a strained channel silicon layer 11 covers a relaxed silicon germanium fin seed fin 10 on an insulator layer 12. The relaxed silicon germanium fin 10 is preferably disposed on an insulator layer 12 (such as silicon dioxide) on a silicon substrate 13. The seed fin 10 is a relaxed silicon germanium fin having lattice constant larger than the lattice constant of silicon, therefore the epitaxial silicon layer 11 grown on the seed fin 10 will be tensilely strained.

The relaxed silicon germanium fin structure is preferably fabricated from a silicon germanium-on-insulator (SGOI) substrate with the concentration of germanium ranging from 10% to 100%. Then the SGOI substrate is patterned into a silicon germanium fin structure. Then a silicon layer is epitaxially deposited on the silicon germanium fin structure. The epitaxial deposition is preferably selectively epitaxial deposition wherein the deposition only occurs on the silicon germanium exposed surfaces. The silicon is under biaxial tensile stress because the lattice constant of silicon is smaller than the lattice constant of silicon germanium. The degree of tensile stress is a function of the concentration of germanium and can be optimized for the desired properties of the silicon device. The strained silicon fin structure as shown in FIG. 1 can become triple gate device in a finFET structure because the silicon channel covers two sides and top of the seed fin structure. The height H of the seed fin is preferably in the range of 10 nm to 200 nm, and the thickness T of the seed fin is preferably in the range of 5 nm to 100 nm. The epitaxial silicon layer thickness is preferably in the range of 5 to 15 nm. The optimized dimensions of the disclosed strained silicon fin structure are preferably chosen to ensure fully depleted body under the operation conditions of the finFET device.

The patterning of the silicon germanium fin from the SGOI substrate is preferably by photolithography where a patterned mask is provided on the substrate, then the substrate is patterned according to the pattern mask, and then the patterned mask is removed. The patterned mask is preferably a photoresist layer, coated and exposed to UV light under a photo mask to transfer a pattern from the photo mask onto the photoresist. The photoresist mask protects the substrate during an etch step to transfer the pattern from the photoresist onto the substrate. And then the photoresist mask can be stripped. The pattern transfer etching is preferably accomplished by reactive ion etching or by wet etches.

SGOI substrates belong to a class of Silicon-On-Insulator (SOI) substrates. The SOI substrate typically consists of a thin surface layer of single crystal silicon on an underlayer of insulating material on a bulk silicon wafer. The thin surface silicon layer, typically a few tens of nanometers to several microns thick, is the silicon channel of the transistor.

The insulating layer, usually made of silicon dioxide, is referred to as the buried oxide and is usually a few hundreds of nanometers thick. The present invention is not limited to just silicon, but applicable to various silicon-containing materials or semiconductor materials such as silicon germanium, silicon carbon, or compound semiconductor materials. Therefore the term "silicon" in "strained silicon fin structure" and "strained silicon finFET device" can mean silicon germanium, carbon doped silicon, or other semiconductor material. The term SOI used in the present invention is also broadened to include all substrates having a thin semiconductor layer on an insulator on a semiconductor substrate. Examples include a silicon layer on a silicon dioxide insulating layer on a silicon substrate (SOI), and a silicon germanium layer on a silicon dioxide insulating layer on a silicon substrate (SGOI). Other example is a carbon doped silicon layer on a silicon dioxide insulating layer on a silicon substrate. The insulator substrate used in the present invention means a substrate having a multilayer on an insulator on a semiconductor support layer. The multilayer can comprise 2 or more semiconductor layers having mismatched lattice constants so that the upper semiconductor layer can be under strain. The bottommost layer of the multilayer is generally a part of the wafer substrate, such as a silicon layer in a SOI substrate, or a silicon germanium layer in a SGOI substrate. To fabricate the insulator substrate having a multilayer, the upper layers of the multilayer can be epitaxially deposited on the bottommost layer of the SOI or SGOI wafer. The multilayer can also comprise a plurality of semiconductor layers and a hard mask layer. Also, the term SOI substrate in the present invention also covers all substrates having similar structures (semiconductor/insulator/semiconductor) such as SIMOX substrates.

Figure 2:
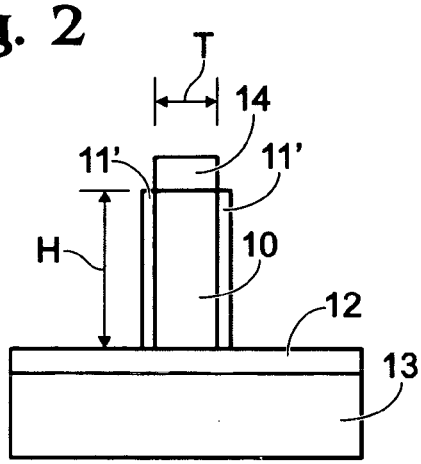
FIG. 2 shows a variation of the embodiment of FIG. 1.

FIG. 2 shows a variation of the above strained silicon fin structure with the addition of a hard mask layer on the seed fin structure. In this variation, the channel layer cover only the two sidewalls of the seed fin structure. With a hard mask 14 on the seed fin, the epitaxial silicon layer 11' only deposited on the silicon germanium exposed sidewall surfaces, and not on the top of the seed fin. The strained silicon channel fin structure as shown in FIG. 2 can become double gate device in a finFET structure because the silicon channel covers only two sides of the seed fin structure.

The epitaxial channel silicon layer 11 or 11' grown on the relaxed silicon germanium seed fin 10 will be tensilely strained because the lattice constant of silicon is smaller than that of silicon germanium. Due to this tensile strain, the six-fold degeneracy of the electron conduction band of the silicon layer is split into a two-fold degenerate band and a four-fold degenerate band. The two-fold degenerate band has smaller energy, and therefore the electrons have smaller effective mass in this band, resulting in the electrons moving faster in the strained silicon channel of the silicon germanium/silicon heterojunction. Thus the mobility of the electrons in the strained silicon channel increases, resulting in the increased speed of the operating transistor. In addition, since the energy level of the two-fold degenerate band is lower than the energy level at the edge of the conduction band in the silicon germanium layer, the silicon germanium/silicon heterojunction serves as a heterobarrier to confine the electrons in the silicon channel.

The tensile strain of the silicon layer also serves to split the two-fold degeneracy valence band into a light hole band and a heavy hole band. Similar to the case of the conduction band, the light hole band has smaller energy, resulting in smaller effective mass of the holes, and an increase in hole mobility in the strained silicon channel device.

In another variation of the above embodiment, the channel layer is an epitaxial carbon doped silicon (SiC) layer or an epitaxial carbon doped silicon germanium (SiGeC) layer. Since the lattice constant of carbon is smaller than the lattice constant of silicon or germanium, carbon doped silicon layer or carbon doped silicon germanium layer fabricated on the silicon germanium seed fin will be tensilely strained, and thus forming a strained carbon doped silicon or a carbon doped silicon germanium fin structure. The concentration of carbon in the carbon doped silicon or silicon germanium is preferably less than 30%.

Similar to strained silicon channel mobility enhancement, the degeneracy of the conduction and valence bands in the SiC and SiGeC layer is similarly split, resulting in an enhancement of electron and hole mobility of the strained SiC and SiGeC channel layer. A further advantage of strained SiC or SiGeC channel layer is that the energy level of the light hole band is higher, and thus the light holes can also be confined in the strained SiC or SiGeC channel layer, similar to and in addition to the confinement of the light electrons.

A further advantage of the strained SiC or SiGeC channel layer is that the seed fin can be silicon. Thus a variation of the above embodiment comprises a SiC or SiGeC channel layer fabricated on a silicon seed fin. Because of the use of silicon wafer substrate, a relaxed silicon seed fin on a silicon-on-insulator (SOI) substrate can be achieved with lower defect level than a relaxed silicon germanium seed layer. For example, to achieve a relaxed silicon germanium layer, the silicon germanium layer should be grown on the silicon substrate until the silicon germanium becomes thick enough to reduce the lattice strain of the silicon germanium layer. However, when the lattice strain of the silicon germanium is relaxed, a large number of dislocations can be generated in the silicon germanium layer. These dislocations may deteriorate the performance characteristics of the transistor and its long-term reliability. Better technology is currently available to reduce the defect level in SGOI substrates, but in general, SOI substrates are more technologically advanced.

In a further variation of the above embodiment, the seed layer is a silicon seed fin, and the epitaxial layer is an epitaxial silicon germanium layer. Because the lattice constant of silicon is smaller than the lattice constant of silicon germanium, the epitaxial silicon germanium layer fabricated on the silicon seed layer will have a compressive strain, and thus forming a compressive strained silicon germanium channel fin structure. In general, compressive strained channel finFET has enhanced hole mobility but little or no enhanced electron mobility, and thus has significant mobility improvement on p-channel transistors.

The fabrication of the above disclosed strained silicon fin structure can be accomplished by semiconductor fabrication process technology as disclosed below. Although illustrated and described below with reference to certain specific fabrication processes, the present invention is nevertheless not intended to be limited to the details shown. The general process of semiconductor fabrication has been practiced for many years, and due to the multitude of different ways of fabricating a device or structure, various modifications may be made in the fabrication process details within the scope and range of the present invention and without departing from the meaning of the invention.

Figure 3A:
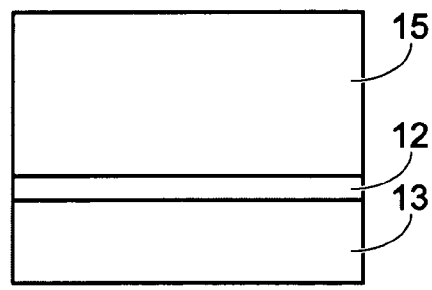
FIGS. 3a–3c show the fabrication process of the embodiment of FIG. 1.
Figure 3B:
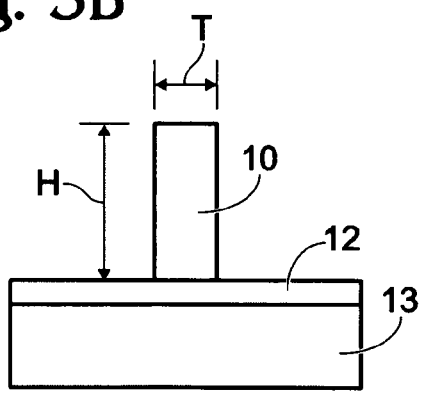
Figure 3C:
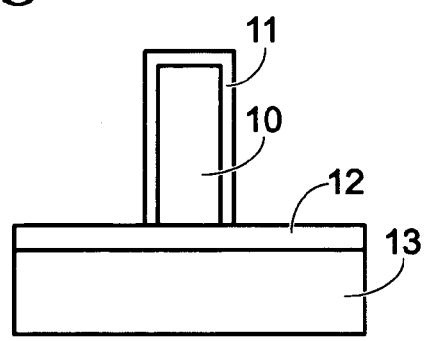

The starting substrate of the above embodiment is a relaxed silicon germanium layer 15 on an insulator 12 on a silicon substrate 13 (SiGe-On-Insulator, SGOI) (FIG. 3a). A fin structure is patterned on the SGOI substrate. The patterning of the silicon germanium fin is preferably by photolithography process. The silicon germanium fin structure 10 after the patterning process is shown in FIG. 3b with a thickness T and height H. FIG. 3b shows the etching of the silicon germanium layer 15 and stopping on the insulator layer 12, but the pattern etching of the fin structure may be over-etched onto the insulator layer 12. The fabrication process continues with a selective deposition of an epitaxial silicon layer 11, covering the exposed surface of the silicon germanium (FIG. 3c). Due to the mismatched lattice constants between the silicon germanium seed fin structure and the epitaxial deposited silicon layer, the deposited silicon layer is under strained to form a strained silicon fin structure.

Figure 4A:
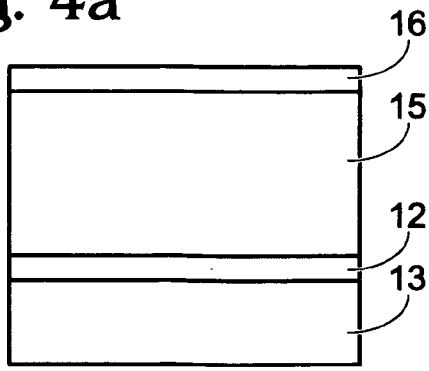
FIGS. 4a–4c show the fabrication process of the embodiment of FIG. 2.

In a variation of the above process sequence, a hard mask 16 can be first deposited on the silicon germanium layer 15 to form a multilayer 16/15 on an insulator 12 on a silicon substrate 13 (FIG. 4a). Then the fabrication process continues as above with the patterning of a fin structure comprising a hard mask section 14 on a silicon germanium fin section 10 (FIG. 4b) with a thickness T and height H, and the selective epitaxial deposition of a silicon layer 11' (FIG. 4c). Since the hard mask is preferably an insulator material such as silicon dioxide or silicon nitride, the selective deposition of the silicon layer only deposited on the two sides of the seed fin structure. The hard mask then can be etched away, or left alone to protect the fin structure during subsequent process steps.

Figure 4B:
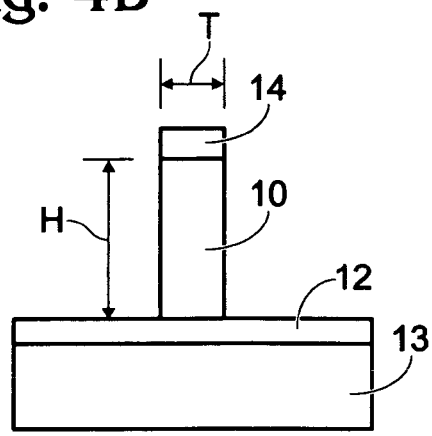
Figure 4C:
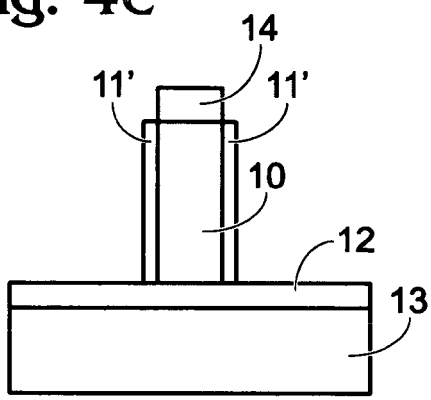

If the hard mask is etched away after the patterning of the fin structure and before the selective deposition of the silicon layer, the complete fin structure after FIG. 4b will be similar to the fin structure shown in FIG. 3c.

The above process sequence description uses silicon germanium and silicon as the seed fin and the strained channel respectively, but the process sequence can also be applied to other material variations. For example, layer 15 can be a silicon layer from a SOI substrate comprising a silicon layer 15 on an insulator 12 on a silicon substrate 13. Thus seed fin 10 can be a silicon seed fin and the channel layer 11 or 11' can be a carbon doped silicon layer or a carbon doped silicon germanium layer.

The present invention strained silicon channel fin structure can further comprise an underseed layer disposed between the seed fin structure and the insulator substrate. The lattice constant of the underseed layer is different from the lattice constant of the seed fin, therefore forcing the seed fin to be strained. In this embodiment, the channel layer can cover both the top side and the two sidewalls of the seed fin, or only the two sidewalls of the seed fin with the help of a hard mask.

Figure 5:
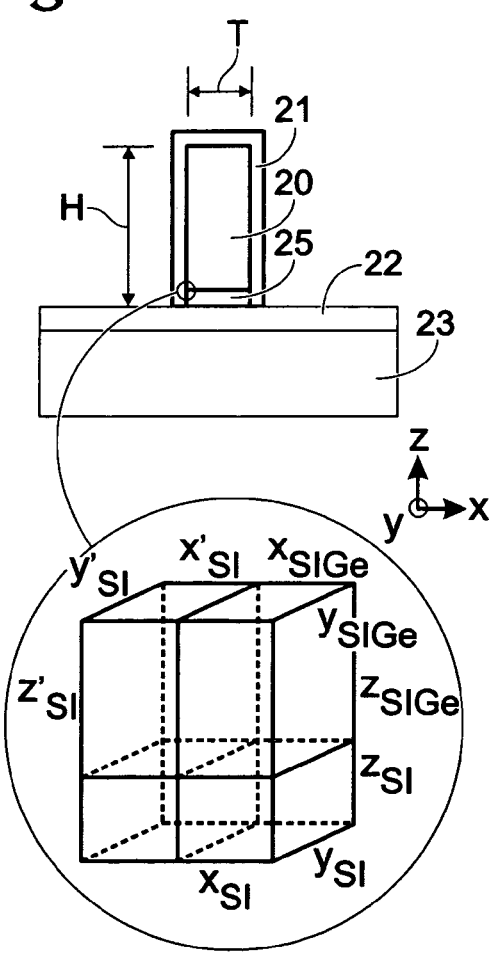
FIG. 5 shows another embodiment of the present invention strained silicon channel fin structure.

FIG. 5 shows the embodiment of the present invention strained silicon channel fin structure with the strained seed fin disposed on an underseed layer. The strained channel silicon 21 covers the strained silicon germanium fin seed layer 20 on a relaxed silicon underseed layer 25 on an insulator layer 22. The relaxed silicon underseed layer 25 is preferably disposed on an insulator layer 22 (such as silicon dioxide) on a silicon substrate 23. Starting from a silicon-on-insulator substrate having a multilayer on an insulator layer, the silicon-on-insulator substrate is patterned into a multilayer seed fin structure. The multilayer is silicon germanium on silicon, preferably fabricated by epitaxially deposition of a layer of silicon germanium on a SOI substrate The multilayer comprises 2 semiconductor layers (silicon germanium layer and silicon layer) having mismatched lattice constant to generate the strained in the upper silicon germanium layer. Then a silicon channel layer 21 is epitaxially deposited on the multilayer fin seed structure. The epitaxial deposition is preferably selectively epitaxial deposition wherein the deposition only occurs on the silicon germanium or silicon surface. The seed fin structure has a thickness of T and a height of H as shown in FIG. 5.

The silicon underseed layer 25 has a relaxed silicon lattice $d_{Si}$ because of the SOI substrate. The lattice constant for the silicon underseed layer 25 is then $x_{Si}=y_{Si}=z_{Si}=d_{Si}$. For the silicon germanium seed layer 20 deposited on the silicon, the lattice constant in the substrate xy plane will preferably match the lattice constant of the silicon underseed layer, therefore the deposited SiGe lattice constant is smaller in the xy plane than the relaxed SiGe lattice constant $d_{SiGe}$: $x_{SiGe}=x_{Si}<d_{SiGe}$, and $y_{SiGe}=y_{Si}<d_{SiGe}$. The lattice constant of the deposited silicon germanium in the z direction has no such constraint, and therefore trying to compensate for the compressive of the lattice constant in the xy direction by becoming tensile in that direction. Thus the deposited SiGe lattice constant could be larger in the z direction than the relaxed SiGe lattice constant $d_{SiGe}$: $z_{SiGe}>d_{SiGe}$. The schematic of the lattice constant of silicon and silicon germanium layers are shown in the inset of FIG. 5.

The epitaxial silicon layer deposited on the strained silicon germanium seed layer will experience some strain. The silicon germanium might experience some lattice shrinkage in the z direction, but in general, the silicon germanium is rigid enough to prevent serious lattice shrinkage, and the lattice constant of the deposited silicon germanium in the z direction could still be larger than the relaxed silicon germanium lattice constant. The epitaxial deposited silicon layer will have the lattice constant $x'_{Si}$, $y'_{Si}$ and $z'_{Si}$ in the x, y, and z directions respectively. The lattice constant of the epitaxial deposited silicon layer in the y and z directions will preferably follow the underlayer lattice constants, namely $y'_{Si}=y_{Si}$ (the relaxed silicon lattice constant) in the y direction, and $z'_{Si}=z_{SiGe}$ (the tensile strained silicon germanium lattice constant, larger than the relaxed silicon lattice constant) in the z direction. In the x direction, there is no such constraint, and the lattice constant of the epitaxial deposited silicon layer in the x direction $x'_{Si}$ can be smaller or larger than the relaxed silicon lattice constant $d_{Si}$. The epitaxial silicon layer could be under tensile strained in the z direction due to the silicon germanium seed. This strain could modify the supposedly stress-free condition of the silicon layer in the y direction, and put the silicon layer in a tensile stress. Even with the silicon germanium lattice constant $z_{SiGe}$ decreasing due to the compressive strain by the epitaxial silicon layer, the epitaxial silicon layer and the silicon germanium will reach an equilibrium condition where both layers could be under strain. It is estimated that under this equilibrium condition, the silicon germanium layer could be under compressive strain in all directions and the epitaxial silicon layer could be under tensile stress in all directions. The compressive strain in the silicon germanium seed layer will further benefit the hole mobility in p-channel PMOS finFET device under this embodiment of the present invention. The silicon germanium layer is preferably having a concentration of germanium ranging from 10% to 100%, and more preferably from 10% to 50%.

Figure 6:
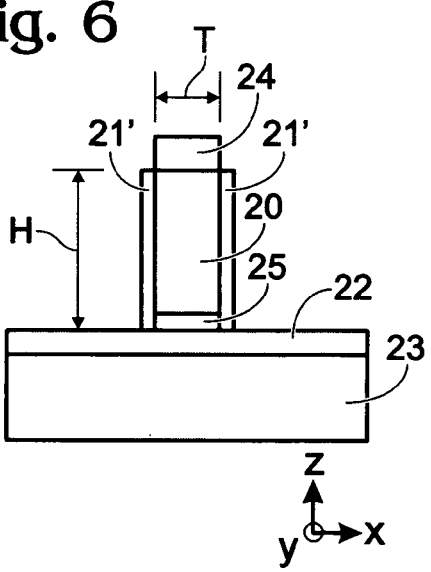
FIG. 6 shows a variation of the embodiment of FIG. 5.

FIG. 6 shows a variation of the above strained silicon channel fin structure. If a hard mask 24 was used and left on the seed fin before the selective epitaxial deposition of the silicon layer, the silicon 21' only deposited on the silicon germanium 20 and silicon 25 exposed surface, and not on the top of the seed fin.

In a variation of the above embodiment, the epitaxial layer is an epitaxial carbon doped silicon (SiC) layer or an epitaxial carbon doped silicon germanium (SiGeC) layer.

Since the lattice constant of carbon is smaller than the lattice constant of silicon or germanium, carbon doped silicon layer or carbon doped silicon germanium layer fabricated on the silicon germanium seed layer will have a tensile strain, and thus forming a strained carbon doped silicon or a carbon doped silicon germanium fin structure.

Figure 7A:
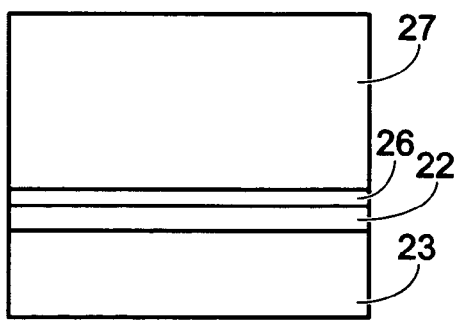
FIGS. 7a–7c show the fabrication process of the embodiment of FIG. 5.
Figure 7B:
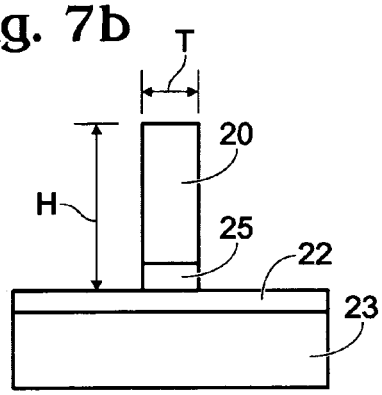
Figure 7C:
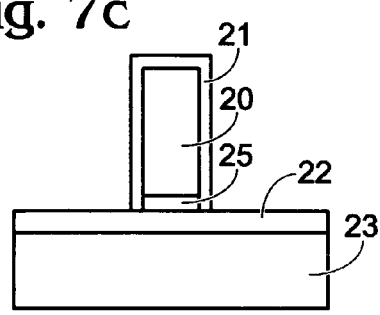

Fabrication process of the above embodiment can start on a silicon layer 26 on an insulator 22 on a silicon substrate 23 (Si-On-Insulator, SOI wafer). The thickness of the silicon layer is preferably between 5 nm to 20 nm, therefore a thinning process can be applied if the silicon thickness of the starting SOI wafer is outside of this range. A preferred thinning process is to oxidize the silicon layer and then wet etch the silicon oxide layer. Then a silicon germanium layer 27 is deposited on the silicon layer 26 (FIG. 7*a*). FIG. 7*a* is a silicon on insulator substrate in which a silicon-containing multilayer (in this case, a silicon germanium/silicon multilayer) is disposed on an insulator layer. Due to the mismatched lattices between silicon and silicon germanium, the silicon germanium layer 27 is under lattice strained. A fin structure is then patterned on the silicon germanium/silicon substrate. The patterning of the silicon germanium/silicon fin is preferably by photolithography process. The fin structure consists of a silicon germanium seed fin 20 on a silicon underseed 25 is shown in FIG. 7*b*. The pattern etching of the fin structure may be over-etched onto the insulator layer 22, or onto the silicon substrate 23. The fabrication process continues with a selective deposition of an epitaxial silicon layer 21, covering the exposed surface of the silicon germanium and silicon (FIG. 7*c*). Due to the mismatched lattice constants between the strained silicon germanium seed fin structure and the epitaxial deposited silicon layer, the deposited silicon layer is under strained to form a strained silicon fin structure.

Figure 8A:
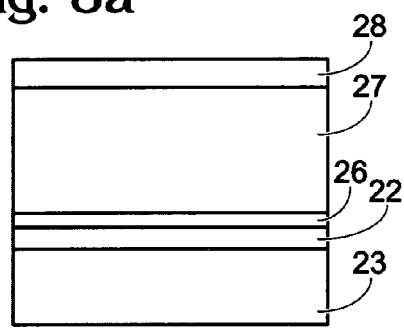
FIGS. 8a–8c show the fabrication process of the embodiment of FIG. 6.

In a variation of the above process sequence, a hard mask 28 can be deposited on the silicon germanium layer 27 (FIG. 8*a*). FIG. 8*a* is a silicon on insulator substrate in which a silicon-containing multilayer (in this case, a hard mask/silicon germanium/silicon multilayer) is disposed on an insulator layer. Then the fabrication process continues as above with the patterning of a fin structure comprising a hard mask section 24 on a silicon germanium fin section 20 on a silicon underseed section 25 (FIG. 8*b*), and the selective epitaxial deposition of a silicon layer 21' (FIG. 8*c*). Since the hard mask is preferably an insulator material such as silicon dioxide or silicon nitride, the selective deposition of the silicon layer only deposited on the two sides of the seed fin structure. The hard mask then can be etched away, or left alone to protect the fin structure during subsequent process steps.

Figure 8B:
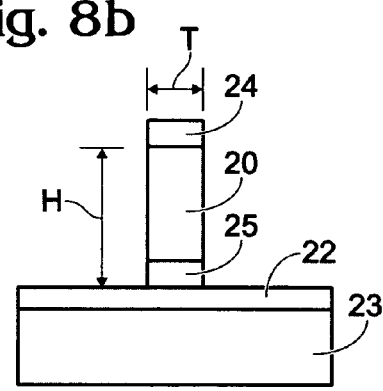
Figure 8C:
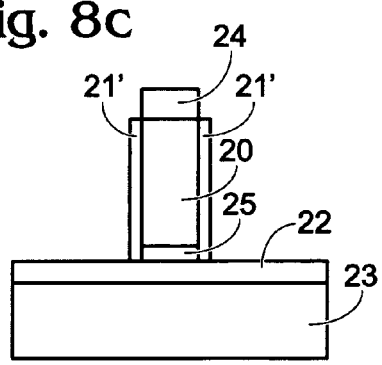

If the hard mask is etched away after the patterning of the fin structure and before the selective deposition of the silicon layer, the complete fin structure after FIG. 8*b* will be similar to the fin structure shown in FIG. 7*c*.

Another embodiment of the present invention strained silicon channel fin structure has the channel layer covering only the top side of the seed fin. The seed fin of this embodiment can be a strained seed fin, but preferably a relaxed seed fin.

Figure 9:
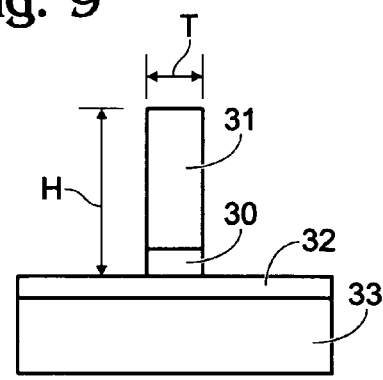
FIG. 9 shows another embodiment of the present invention strained silicon channel fin structure.
Figure 10:
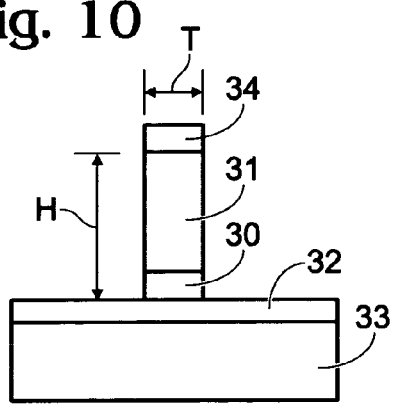
FIG. 10 shows a variation of the embodiment of FIG. 9.

In FIG. 9 the strained channel silicon 31 is fabricated on the relaxed silicon germanium seed layer 30 on an insulator layer 22. The relaxed silicon germanium seed layer 30 is preferably disposed on an insulator layer 32 (such as silicon dioxide) on a silicon substrate 33. FIG. 10 shows a variation of the above strained silicon channel fin structure comprising a hard mask 34 on the strained silicon fin 31.

In a variation of the above embodiment, the strained channel material is carbon doped silicon (SiC) or carbon doped silicon germanium (SiGeC). In further variations of the above embodiment, the seed layer is a silicon layer of a SOI substrate. In these variations, the strained channel can be silicon germanium, carbon doped silicon (SiC) or carbon doped silicon germanium (SiGeC).

Figure 11A:
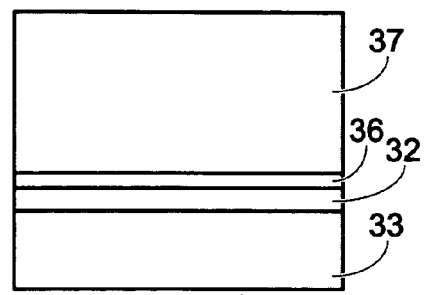
FIGS. 11a–11b show the fabrication process of the embodiment of FIG. 9.
Figure 11B:
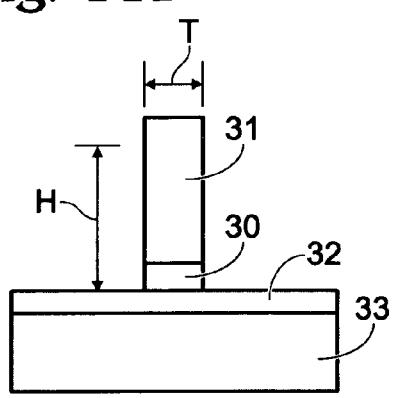

The fabrication process of the above embodiment starts with a silicon layer 36 on an insulator 32 on a silicon substrate 33 (Si-On-Insulator, SOI wafer). The thickness of the silicon layer is preferably between 5 nm to 20 nm, therefore a thinning process can be applied if the silicon thickness of the starting SOI wafer is outside of this range. Then a silicon germanium layer 37 is deposited on the silicon layer 36 (FIG. 11*a*). A fin structure is then patterned on the silicon germanium/silicon substrate, stopping on the insulator layer 32, or over-etched onto the insulator layer 32 or the silicon substrate 33. The patterning of the silicon germanium/silicon fin is preferably by photolithography process. The fin structure consisting of a silicon germanium strained channel fin 31 on a silicon seed 30 is shown in FIG. 11*b*.

Figure 12A:
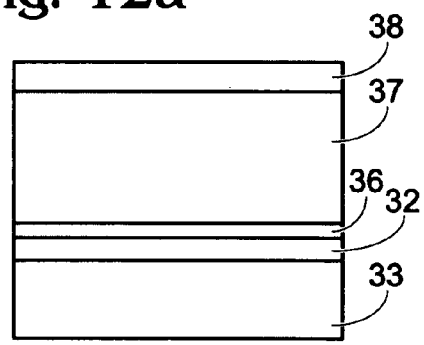
FIGS. 12a–12b show the fabrication process of the embodiment of FIG. 10.
Figure 12B:
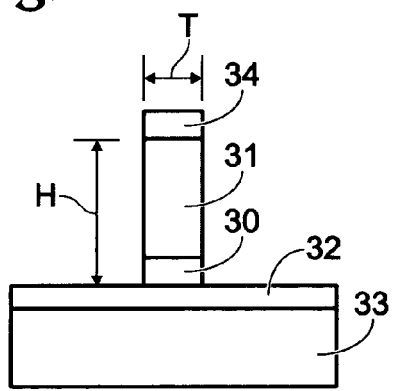

In a variation of the above process sequence, a hard mask 38 can be deposited on the silicon germanium layer 37 (FIG. 12*a*). Then the fabrication process continues as above with the patterning of a fin structure comprising a hard mask section 34 on a silicon germanium fin section 31 on a silicon seed section 30 (FIG. 12*b*).

The present invention discloses a strained silicon fin structure. Within the scope of the invention, the basic component of the strained silicon fin structure is silicon, therefore the term "strained silicon" within the scope of the invention refers to "strained silicon-containing" material, such as silicon germanium, carbon doped silicon. Although the above description details silicon-containing fin structure, the present invention also could be used for compound semiconductors, or other semiconductor materials wherein the strained semiconductor channel fin structure could make an improvement in carrier mobility. Furthermore, although the above description details a strained silicon fin structure on an insulator substrate, the present invention could also be used for bulk semiconductor substrate such as a silicon wafer.

The present invention strained silicon channel fin structure is also employed to fabricate a strained silicon finFET device as disclosed below.

The present invention finFET device is a double gate MOSFET device consisting of a strained silicon channel formed in a silicon vertical fin controlled by a self-aligned double gate. The finFET structure includes an ultra thin silicon fin for suppression of the short channel effect, and two self-aligned gates to control the entire fully depleted channel film. In finFET structure, the gate length of the finFET structure is the distance between the source and drain and often is defined by a spacer gap. The device width of the finFET structure is the fin height because the current flows along the vertical surface of the fin. This width definition counts only one side of the channel. Because there are two gates controlling both sides of the fin, the fin thickness equals the twice the body thickness. The channel film width in a finFET device is less than channel length, and the double gates on the channel fin effectively suppress short channel effect and enhance drive current. Self-aligned gates in which the two gates are self-aligned to each other and to the source and drain regions are preferred for reducing parasitic gate capacitance, series resistance and for control of the channel length. The disclosed strained silicon finFET device can further have raised source and drain to reduce parasitic resistance. Since the fin is thin, doping of the fin is not required to suppress short channel effect and undoped silicon can be used as device channel, reducing mobility degradation due to impurity scattering.

Further improvement of the present invention finFET device is the addition of the strained channel fin structure as disclosed above. A strained channel finFET device could achieves significant hole and/or electron mobility enhancement. Enhanced carrier mobility could allow strained silicon finFET devices to exhibit significantly increased performance over their bulk silicon counterparts or their non-strained silicon finFET counterparts at identical gate lengths.

FIG. 13 shows a perspective view of the present invention strained silicon finFET device. The strained silicon finFET structure includes a strained silicon fin structure 52 on an insulator layer 42 on a substrate 43, a gate dielectric layer covering the strained channel fin, and a gate 48 extending across the strain channel fin 52 and electrically isolated from the strained channel fin 52 by the gate dielectric. The strained silicon finFET structure further includes a source 47 and a drain 51 sandwiching the strained silicon fin 52. An optional dielectric hard mask 46 covers the source, drain and channel fin. A dielectric spacer 49 covers and isolates the gate 48.

The strained silicon finFET structure is preferably fabricated on an insulator substrate such as a silicon-on-insulator (SOI) substrate. It is also possible that the disclosed strained silicon finFET device is fabricated on a bulk semiconductor substrate such as a bulk silicon wafer.

The disclosed strained silicon finFET device employs a strained silicon channel fin structure as disclosed in details above. To recapitulate, the disclosed strained silicon channel fin structure comprises a strained silicon-containing channel layer deposited on a seed fin having mismatched lattice. The mismatch lattices between the seed fin and the overlaid channel layer generates the strain in the channel layer.

Various embodiments of the seed fin and the overlaid channel layer having mismatch lattices are:

an epitaxial channel layer deposited on a seed fin, for example
  an epitaxial silicon layer deposited on a relaxed silicon germanium seed fin with the silicon germanium fin fabricated from a SGOI substrate;
  an epitaxial silicon germanium layer deposited on a relaxed silicon seed fin with the silicon fin fabricated from a SOI substrate;
  an epitaxial carbon doped silicon layer deposited on a relaxed silicon germanium seed fin with the silicon germanium fin fabricated from a SGOI substrate;
  an epitaxial carbon doped silicon layer deposited on a relaxed silicon seed fin with the silicon fin fabricated from a SOI substrate;
  an epitaxial carbon doped silicon germanium layer deposited on a relaxed silicon germanium seed fin with the silicon germanium fin fabricated from a SGOI substrate;
  an epitaxial carbon doped silicon germanium layer deposited on a relaxed silicon seed fin with the silicon fin fabricated from a SOI substrate;
an epitaxial channel layer deposited on a seed fin with the seed fin fabricated on an underseed layer, for example
  an epitaxial silicon layer deposited on a silicon germanium seed fin on a silicon underseed layer with the multilayer silicon germanium/silicon fin fabricated from a SOI substrate;
  an epitaxial carbon doped silicon layer deposited on a silicon germanium seed fin on a silicon underseed layer with the multilayer silicon germanium/silicon fin fabricated from a SOI substrate;
  an epitaxial carbon doped silicon germanium layer deposited on a silicon germanium seed fin on a silicon underseed layer with the multilayer silicon germanium/silicon fin fabricated from a SOI substrate;
a channel/seed multilayer on a insulator substrate fabricated into a fin structure, for example
  an epitaxial silicon layer deposited on a silicon germanium seed layer of a SGOI substrate;
  an epitaxial carbon doped silicon layer deposited on a silicon germanium seed layer of a SGOI substrate;
  an epitaxial carbon doped silicon germanium layer deposited on a silicon germanium seed layer of a SGOI substrate;
  an epitaxial carbon doped silicon layer deposited on a silicon seed layer of a SOI substrate;
  an epitaxial carbon doped silicon germanium layer deposited on a silicon seed layer of a SOI substrate.

FIG. 14 shows the top view of the disclosed strained silicon finFET device having the first embodiment of a silicon layer on a seed fin structure without a hard mask. The finFET is a field effect transistor having a source 106 and a drain 107 separated by a channel 104. The channel 104 conduction is controlled by the double gate 103, extending and covering the channel 104, and connected to the gate electrode 108. The double gate 103 is electrically isolated from the channel 104 by a spacer 109 and a gate dielectric 110. The double gate 103 is actually a triple gate because it covers both sides and the top of the strained silicon channel 104. The term "double gate" in the context of the present invention is a generic term to mean "more than one gate", and therefore covers double or triple gate device.

FIG. 14 also shows the cross section AA', cutting through the fin channel 104 of the finFET structure. The finFET device is preferably fabricated on an insulator layer 102 on a substrate 101. The finFET channel is a strained silicon channel, comprising a seed fin 105 and a strained silicon channel 104, covering both sides and the top of the seed fin 105. The finFET device becomes a triple gate device because the gate 103 covers the strained silicon channel 104 on both sides and also on the top of the fin. The triple gate 103 is isolated from the channel 104 by a gate dielectric 110.

FIG. 14 further shows the cross section BB', cutting through the triple gate 103 of the finFET structure. The cross section BB' cuts through the seed fin layer 105 on a insulator layer 102 and a substrate 101, the strained silicon channel 104 and the gate dielectric 110. The triple gate 103 also covers the top section of the fin structure, with the spacer 109 to isolate the triple gate 103 from the silicon channel 104.

In a variation of the above embodiment with a silicon layer on a seed fin with a hard mask, FIG. 15 shows the cross section AA', cutting through the fin channel 104 of the new variation finFET structure. The finFET channel is a strained silicon channel, comprising a seed fin 105, a hard mask 111 and a strained silicon channel 104 selectively grown on the seed fin 105. The double gate 103 covers the strained silicon channel 104 and is isolated from the channel 104 by a gate dielectric 110.

FIG. 15 also shows the cross section BB' of the new variation finFET structure, cutting through the double gate 103 of the finFET structure. The cross section BB' cuts through the seed fin layer 105 positioned on a insulator layer 102 and a substrate 101, and the hard mask layer 111. The double gate 103 has the spacer 109 to isolate the double gate 103 from the silicon channel 104.

FIG. 16 shows the cross section AA' for another embodiment of the finFET structure having a silicon layer on a seed fin structure with the seed fin structure generated from a underseed layer. The finFET device is fabricated on an insulator layer 122 on a substrate 121. The finFET channel is a strained silicon channel, comprising a seed fin 125 grown on an underseed layer 132, and a strained silicon channel 124 selectively grown on the seed fin 125 and the underseed layer 132. The double gate 123 covers the strained silicon channel 124 and is isolated from the channel 124 by a gate dielectric 130.

FIG. 17 shows the cross section AA' for another embodiment of the finFET structure having a silicon layer on a seed layer. The finFET device is fabricated on an insulator layer 142 on a substrate 141. The finFET channel is a strained silicon channel, comprising a seed layer 145, and a strained silicon channel 144 grown on the seed layer 145. The double gate 143 covers the strained silicon channel 144 and is isolated from the channel 144 by a gate dielectric 150.

The disclosed strained silicon finFET structure is preferably having the thickness of the fin structure is between 10 nm to 200 nm, the width of the fin structure is between 5 nm to 100 nm, and the thickness of the strained channel is between 5 nm to 15 nm. The width of the present invention strained channel fin structure is preferably less than the gate length to ensure fully depleted body. The strained silicon finFET structure preferably has the strained channel fabricated on two sides of the fin structure, or more preferably on two sides and on top of the fin structure. The strained silicon finFET structure preferably further comprises LDD (lightly doped drain) and Halo implantation where the source and drain regions include a lightly doped region extending to the channel region, doping implantation for the strained channel, source and drain where the source and drain regions are preferably more heavily doped than the channel region, and the silicidation of the source, drain, and gates. The gate dielectric of the disclosed strained silicon finFET structure is preferably thermally grown silicon dioxide, deposited silicon dioxide, or high k dielectric material such as hafnium oxide, zirconium oxide, aluminum oxide, hafnium silicate, zirconium silicate, aluminum silicate, or any combination or alloy thereof. The equivalent silicon dioxide thickness of the gate dielectric is preferably between 0.3 nm and 3 nm. The gate of the disclosed strained silicon finFET structure is preferably polysilicon, doped polysilicon or metal.

The fabrication of the above disclosed strained silicon finFET device can be accomplished by semiconductor fabrication process technology as disclosed below. Although illustrated and described below with reference to certain specific fabrication processes, the present invention is nevertheless not intended to be limited to the details shown. The general process of semiconductor fabrication has been practiced for many years, and due to the multitude of different ways of fabricating a device or structure, various modifications may be made in the fabrication process details within the scope and range of the present invention and without departing from the meaning of the invention.

The fabrication process of the present invention strained silicon finFET device starts with the fabrication of a strained silicon channel fin structure as shown in FIG. 1, FIG. 2, FIG. 5, FIG. 6, FIG. 9, or FIG. 10. The fabrication process for these various embodiments are similar, and therefore only one embodiment is shown below.

Figure 18E:
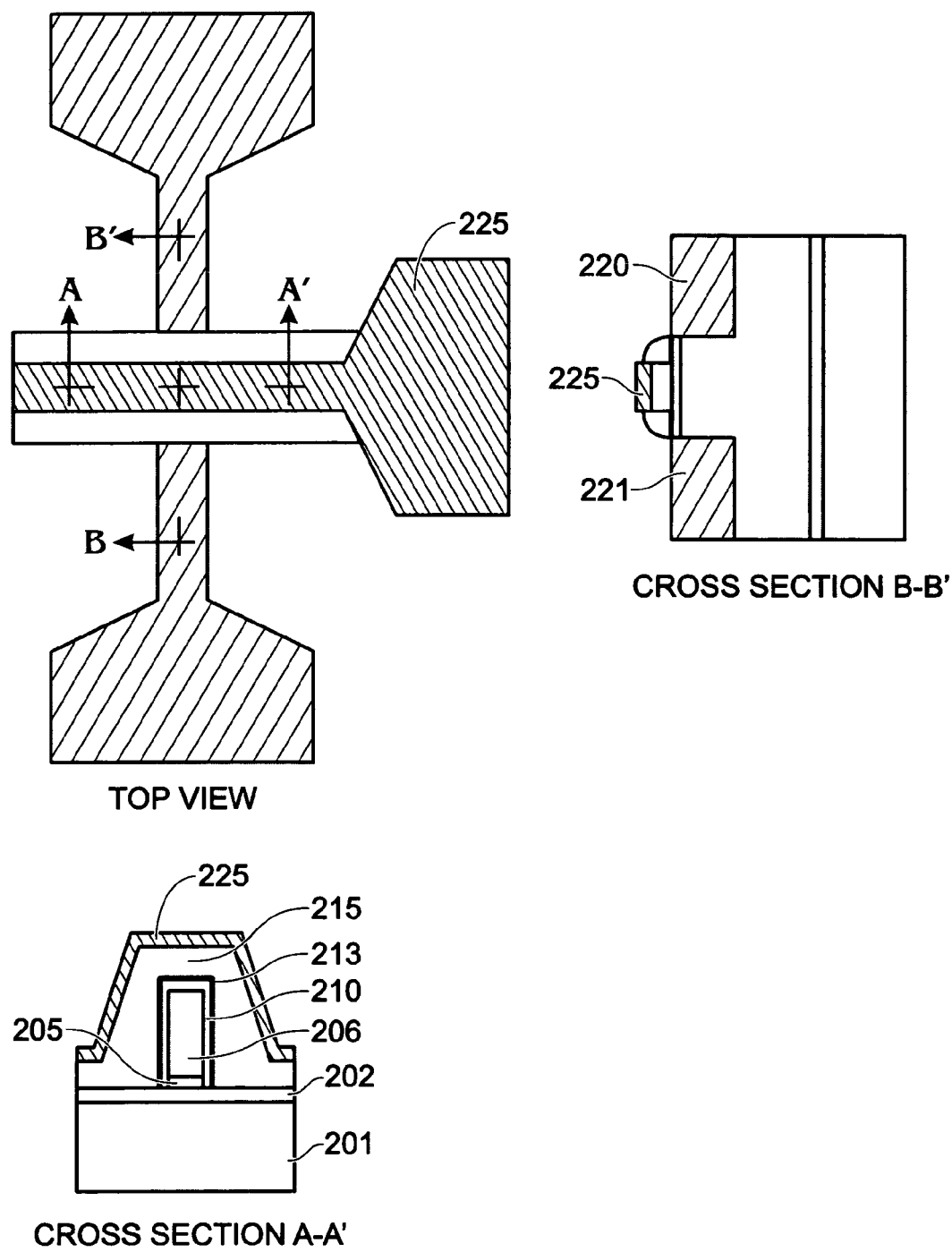

FIGS. 18a–18e show the steps in the fabrication of the strained silicon finFET device in accordance with one embodiment of the invention, a silicon layer on a seed fin structure, with the seed fin structure generated from a underseed layer. In FIG. 18a, a silicon on insulator substrate having a silicon-containing multilayer on an insulator layer is provided. The silicon-containing multilayer comprises a silicon germanium layer 204 on a silicon layer 203. The silicon germanium layer 204 is preferably epitaxially deposited on the silicon layer 203, or can be germanium implanted into a silicon layer. The silicon layer 203 is a part of an insulator SOI or SIMOX substrate comprising a silicon substrate 201, a buried oxide layer 202, and the silicon layer 203. In other aspect of the invention, the multilayer can further comprise a hard mask layer deposited on top of the silicon germanium layer. The silicon layer 203 serves as an underseed layer with the thickness preferably between 5 nm to 20 nm. A silicon thinning step may be performed if the thickness of the silicon layer of the starting substrate is outside this range. The silicon thinning step is preferably an oxidation/etching step wherein the silicon is oxidized and then the silicon oxide is selectively etched away. The oxidation is preferably thermal oxidation or rapid thermal oxidation, and the selective etch is preferably wet etch with HF solution, or reactive ion etching. After thinning the silicon layer to the desired thickness, a layer of silicon germanium 204 is epitaxially deposited on the silicon layer 203. The combined thickness of the silicon germanium layer 204 and the silicon layer 203 defines the width of the finFET device. The silicon germanium is under strained and will serves as a seed layer for the strained channel of the strained silicon finFET structure. A hard mask layer may be deposited (not shown) on the silicon germanium layer to protect the silicon germanium surface and to allow the use of aggressive etch chemistries such as plasma etching.

A photoresist is applied to define a pattern through the use of optical lithography, electron beam lithography, x-ray lithography, or other conventional means to produce a photoresist mask comprising a fin channel between a source and drain structures. After the photoresist mask definition, an etch process is used to pattern the silicon germanium layer 204 and the silicon layer 203. Then the photoresist is stripped and the partially-fabricated device is shown in FIG. 18b. The device formation includes a source 207 and a drain 208 sandwiching a strained silicon germanium seed fin 206 on an underseed layer 205. A sacrificial oxidation process may be used to repair any damage done to the seed fin surface during the etch process. The oxidation process may also be used to reduce the seed fin width, thereby allowing sub-lithographic dimension to be achieved. The sacrificial oxidation may be performed by thermal oxidation process or rapid thermal oxidation process. The sacrificial oxide is then stripped to expose the silicon and silicon germanium surface. The height of the fin is preferably between 10 nm to 200 nm, and the width of the fin is preferably between 5 nm to 100 nm.

A selective epitaxial silicon layer is next deposited on the seed fin surface as shown in FIG. 18c. The silicon thickness is between 5 nm to 15 nm and is under stress due to the mismatched lattice with the silicon germanium seed fin 206 and the silicon underseed layer 205. The epitaxial silicon layer forms the strained silicon channel 210, and also covers the drain 211 and the source 212. A channel ion implantation step may be applied to the silicon channel fin structure to optimize the device performance such as work function adjustments. The implanted dopants may be selected to permit dual work function adjustments for both p-type and n-type devices. Since the fin is thin, channel ion implantation doping may not be required to suppress short channel effect. The threshold voltage of the device can be controlled by adjusting the work function of the gate, for example by using silicon germanium alloy or a refractory metal or compound such as titanium nitride.

A gate dielectric layer 213 is grown or deposited on the strained silicon channel fin structure. The gate dielectric can thermally grown silicon oxide, deposited silicon oxide, silicon nitride, a high dielectric constant material such as hafnium oxide, zirconium oxide, aluminum oxide, hafnium silicate, zirconium silicate, aluminum silicate, or any combination or alloy thereof. The oxide equivalent thickness of the gate dielectric is preferably between 0.3 nm and 10 nm, and more preferably between 0.3 nm and 3 nm. Next a gate material layer is deposited over the surface. The gate material can be polysilicon, silicon germanium, a refractory metal or compound such as titanium nitride or molybdenum, or other suitable conductive material such as aluminum, copper, or aluminum copper alloy. If the polysilicon gate material is used, the gate may be doped by ion implantation at this step. A gate mask is defined, preferably by photolithography technique, and then the underlying gate material is etched to form the gate electrode 216 and the gate 215 across the strained silicon channel 210. The gate etching process stops on the gate dielectric 213 and the insulator layer 202. If a hard mask is used, the gate etching can stop on the hard mask instead on the thin gate dielectric, and therefore the hard mask can protect the silicon active area during the gate etching step. The gate 215 is electrically isolated from the silicon channel 210 by the gate dielectric 213. A light implant of appropriate dopants then may be used to form a lightly doped drain (LDD) and/or halo region. A spacer then is formed on the sidewalls of the gate and the channel by deposition and non-isotropic etching of a dielectric such as silicon oxide or silicon nitride. The spacer on the sidewalls of the channel or other areas may be removed if desired by an additional etching, leaving the gate spacer 217 on either side of gate 215 as shown in FIG. 18d.

After spacer formation is the formation of the source and drain by ion implantation. The polysilicon gate 225 may also be doped at this step if not already doped. The doping may be accomplished by ion implantation, gas immersion laser doping, ion shower doping, gas or solid source diffusion. The dopant species and concentration are chosen to achieve the required device characteristics such as n-type or p-type device. Angled or shallow ion implantation may be used to dope the sides and top of the source and drain region. Any implant damage can be annealed at high temperatures. The series resistance of the source and drain can also be reduced by treating the source 221 and drain 220 with a highly conductive material such as a silicide deposition process (where a silicide is deposited on the source and drain) or a self aligned silicide (salicide) process (where a metal is deposited on the source and drain and subsequently reacts with silicon to form a silicide). A number of silicide or salicide processes are available such as titanium silicide, cobalt silicide, nickel silicide, or palladium silicide (FIG. 18e). The processing can be continued with other state of the art device fabrication processes to finish the device or circuit fabrication.

In an alternative embodiment, the method can use a bulk substrate or an insulator substrate (such as glass or plastic) instead of a SOI substrate. The method can also be used to fabricate vertically aligned NMOS and PMOS transistors separated by a dielectric layer and having a common gate, for example, see Hu et al., U.S. Pat. No. 6,413,802, hereby incorporated by reference. CMP technique can also be employed for the fabrication of the finFET structure according to the present invention, for example, see Muller et al., U.S. Pat. Nos. 6,252,284 and 6,432,829, hereby incorporated by reference. The method can also be used to fabricate strained silicon finFET device where the double gates are two separate gates with two separate gate electrodes, for example see Yu, U.S. Pat. No. 6,458,662, hereby incorporated by reference. The method can also be used to fabricate strained silicon finFET device where the double gates have different widths, for example see Ieong et al., U.S. Pat. No. 6,492,212, hereby incorporated by reference.

What is claimed is:

1. A strained silicon fin structure comprising
   an insulator substrate:
   a silicon seed fin structure disposed on the substrate;
   an underseed layer disposed between the seed fin structure and the substrate, the underseed layer material having a lattice constant different than that of the seed fin material, whereby the seed fin structure is under strain due to the lattice mismatch between the underseed layer material and the seed fin material;
   a strained channel layer fabricated on the seed fin structure, the channel layer material having a lattice constant different than that of the seed fin material, and
   whereby the channel layer strain is the result of the lattice mismatch between the channel layer material and the seed fin material.

2. A strained silicon fin structure as in claim 1 further comprising a hard mask insulator layer on the seed fin structure.

3. A strained silicon finFET device comprising
   an insulator substrate;
   a source and a drain sandwiching a strained channel region disposing on the substrate, the strained channel comprising
   a seed fin structure;
   an underseed layer disposed between the seed fin structure and the substrate, the underseed layer material having a lattice constant different than that of the seed fin material, whereby the seed fin structure is under strain due to the lattice mismatch between the underseed layer material and the seed fin material;
   a strained channel material having a lattice constant different than that of the seed fin material;
   a gate dielectric layer disposed on the strained channel; and
   a gate over the strained channel and electrically isolated therefrom by the gate dielectric.

4. A strained silicon finFET device as in claim 3 wherein the seed fin structure material is silicon germanium or silicon.

5. A strained silicon finFET device as in claim 3 wherein the channel layer material is epitaxial silicon, epitaxial silicon germanium, epitaxial carbon doped silicon, or epitaxial carbon doped silicon germanium.

6. A strained silicon finFET device as in claim 3 further comprising a hard mask insulator layer on the seed fin structure.

7. A strained silicon finFET device as in claim 3 further comprising doping implantation for the strained channel and the source and drain.

8. A strained silicon finFET device as in claim 3 wherein the source region and the drain region include a lightly doped region extending to the channel region.

9. A strained silicon finFET device as in claim 3 further comprising silicidation of the gate, source and drain.

* * * * *